United States Patent
Tang et al.

(10) Patent No.: US 8,918,705 B1
(45) Date of Patent: Dec. 23, 2014

(54) ERROR RECOVERY BY MODIFYING SOFT INFORMATION

(71) Applicant: SK hynix memory solutions inc., San Jose, CA (US)

(72) Inventors: Xiangyu Tang, San Jose, CA (US); Yingquan Wu, Palo Alto, CA (US)

(73) Assignee: SK hynix memory solutions inc., San Jose, CA (US)

( * ) Notice: Subject to any disclaimer, the term of this patent is extended or adjusted under 35 U.S.C. 154(b) by 49 days.

(21) Appl. No.: 13/734,108

(22) Filed: Jan. 4, 2013

Related U.S. Application Data

(60) Provisional application No. 61/585,575, filed on Jan. 11, 2012.

(51) Int. Cl.
| | |
|---|---|
| *H03M 13/00* | (2006.01) |
| *H03M 13/05* | (2006.01) |
| *H03M 13/39* | (2006.01) |
| *H03M 13/45* | (2006.01) |
| *H03M 13/11* | (2006.01) |

(52) U.S. Cl.
CPC .......... *H03M 13/05* (2013.01); *H03M 13/1111* (2013.01); *H03M 13/3927* (2013.01); *H03M 13/45* (2013.01)
USPC ............ 714/780; 714/763; 714/784; 714/799

(58) Field of Classification Search
CPC . H03M 13/45; H03M 13/3927; H03M 13/05; H03M 13/1111
USPC .................................. 714/780, 763, 784, 799
See application file for complete search history.

(56) References Cited

U.S. PATENT DOCUMENTS

| | | | |
|---|---|---|---|
| 7,904,780 B2 | 3/2011 | Brandman | |
| 7,904,793 B2 * | 3/2011 | Mokhlesi et al. | ............. 714/780 |
| 7,966,546 B2 | 6/2011 | Mokhlesi et al. | |
| 7,966,550 B2 * | 6/2011 | Mokhlesi et al. | ............. 714/780 |
| 8,261,170 B2 | 9/2012 | Yedidia et al. | |
| 8,301,979 B2 | 10/2012 | Sharon et al. | |
| 8,335,977 B2 | 12/2012 | Weingarten et al. | |
| 8,621,321 B2 * | 12/2013 | Steiner et al. | ................. 714/758 |
| 2006/0015791 A1 | 1/2006 | Kikuchi et al. | |
| 2007/0104300 A1 | 5/2007 | Esumi et al. | |
| 2007/0124657 A1 | 5/2007 | Orio | |
| 2007/0171714 A1 | 7/2007 | Wu et al. | |
| 2007/0283214 A1 | 12/2007 | Lasser | |
| 2008/0244360 A1 * | 10/2008 | Mokhlesi et al. | ............. 714/758 |
| 2008/0276156 A1 | 11/2008 | Gunnam et al. | |
| 2008/0301521 A1 | 12/2008 | Gunnam et al. | |

(Continued)

OTHER PUBLICATIONS

Park et al., "Reliability and Performance Enhancement Technique for SSD array storage system using RAID mechanism", ISCIT 2009, IEEE, 2009.

(Continued)

*Primary Examiner* — John Trimmings
(74) *Attorney, Agent, or Firm* — Van Pelt, Yi & James LLP

(57) ABSTRACT

One or more locations in a plurality of data bit sequences that do not satisfy parity and are associated with data bit sequences that are unable to be successfully error correction decoded are determined. Soft information associated with the determined locations is modified and error correction decoding using the modified soft information is performed.

29 Claims, 6 Drawing Sheets

(56) References Cited

U.S. PATENT DOCUMENTS

Figure 1:
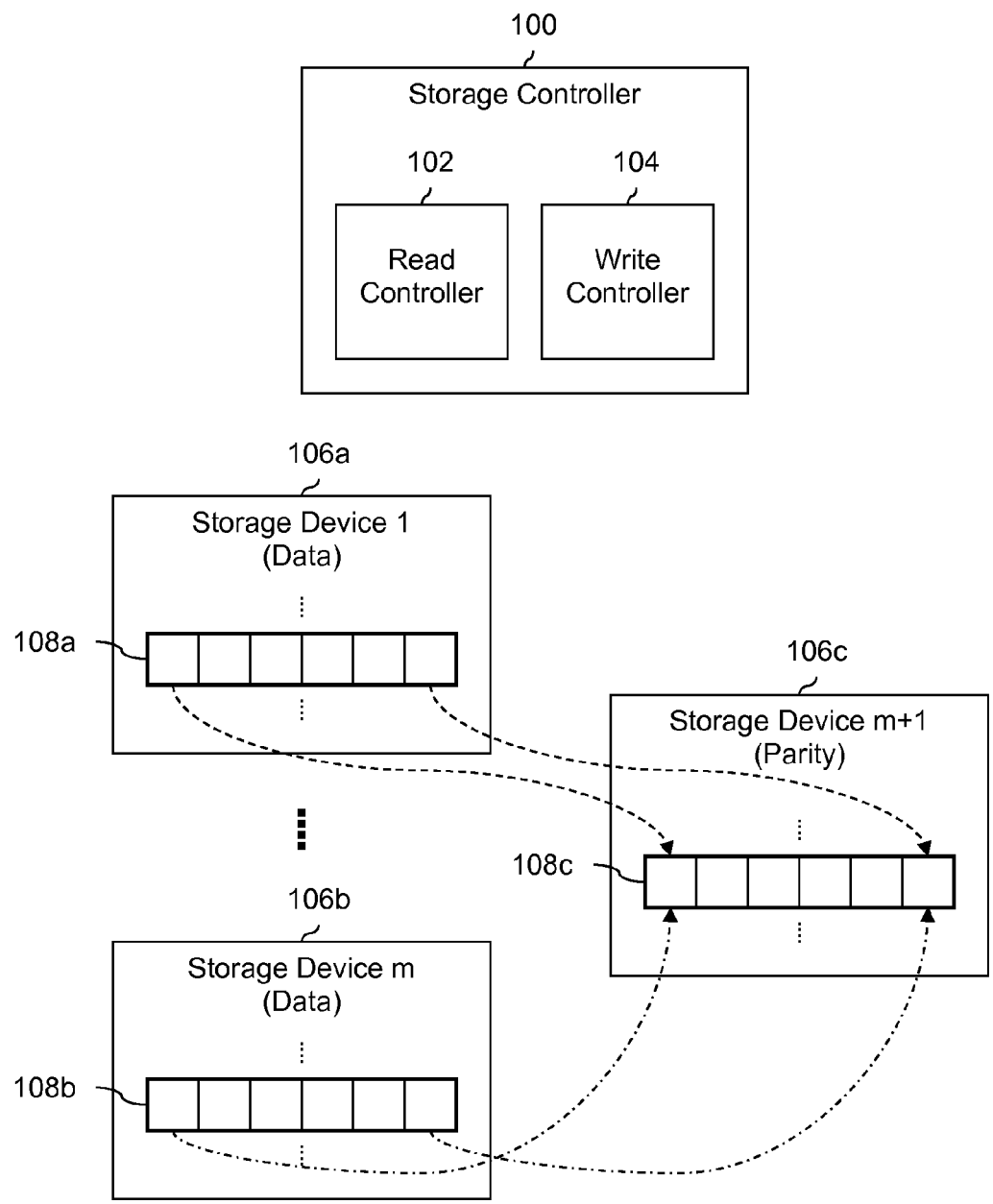

| | | |
|---|---|---|
| 2009/0070656 A1 | 3/2009 | Jo et al. |
| 2009/0199069 A1 | 8/2009 | Palanki et al. |
| 2011/0004812 A1 | 1/2011 | Yang |
| 2011/0072331 A1* | 3/2011 | Sakaue et al. ................ 714/763 |
| 2011/0231738 A1* | 9/2011 | Horisaki ....................... 714/773 |
| 2011/0296280 A1 | 12/2011 | Achir et al. |
| 2012/0159282 A1* | 6/2012 | Ito ................................ 714/758 |

OTHER PUBLICATIONS

Blaum et al., "EVENODD: An Efficient Scheme for Tolerating Double Disk Failures in RAID Architectures", IEEE Transactions on Computers, Feb. 1995, vol. 44, No. 2.

Fossorier et al., "Reduced Complexity Iterative Decoding of Low-Density Parity Check Codes Based on Belief Propagation", IEEE Transactions on Communications, May 1999, vol. 47, No. 5.

* cited by examiner

ERROR RECOVERY BY MODIFYING SOFT INFORMATION

CROSS REFERENCE TO OTHER APPLICATIONS

This application claims priority to U.S. Provisional Patent Application No. 61/585,575 entitled CHIP RELIABILITY IN SOLID STATE DRIVES THROUGH NOVEL TURBO MESSAGE-PASSING DECODING OF PRODUCT LDPC-PARITY CODES filed Jan. 11, 2012 which is incorporated herein by reference for all purposes.

BACKGROUND OF THE INVENTION

Some storage systems include multiple semiconductor "chips" of storage media. In one example, a solid state storage system includes 16 Flash chips. 15 of the 16 chips are used to store user or application data and the $16^{th}$ chip is used to store parity from the data stored on the other 15 chips. In the event one of the 15 data chips fails or data from one of the 15 data chips cannot be successfully error correction decoded, the parity stored on the $16^{th}$ chip can be used to recover the desired data. However, the corresponding data from all of the other 14 data chips is required to be available and/or successfully error correction decoded. New techniques which can be used in the event two or more data chips fail and/or data from two or more data chips is unable to be successfully error correction decoded would be desirable.

BRIEF DESCRIPTION OF THE DRAWINGS

Various embodiments of the invention are disclosed in the following detailed description and the accompanying drawings.

FIG. 1 is a diagram showing an embodiment of a storage system which includes a plurality of storage devices used to store data and parity.

FIG. 2 is a flowchart illustrating an embodiment of a soft information modification technique.

FIG. 3 is a diagram showing an embodiment of a plurality of data bit sequences and a related parity bit sequence.

FIG. 4 is a diagram showing an embodiment in which soft information is replaced with an erasure.

FIG. 5 is a diagram showing an embodiment in which soft information is modified using soft information from other bit locations within a codeword.

FIG. 6 is a diagram showing an embodiment of a read controller configured to perform soft information modification.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a diagram showing an embodiment of a storage system which includes a plurality of storage devices used to store data and parity. In various embodiments, one or more of storage controller 100 and storage devices 106*a*-106*c* is/are a semiconductor device, such as an application-specific integrated circuit (ASIC) or a field-programmable gate array (FPGA). A semiconductor device may sometimes be referred to as a chip.

In the example shown, storage controller 100 includes write controller 104. Write controller 104 performs error correction encoding on the data (e.g., user data or application data) to obtain encoded data; the encoded data is stored in storage devices 106*a*-106*b*. Some example error correction codes include low-density parity-check (LDPC) codes, Reed-Solomon (RS) codes, Hamming codes, and linear block codes. In some embodiments, an error correction code is a systematic code where the input data (i.e., prior to error correction encoding) is included in the encoded data.

Write controller 104 combines the error correction encoded data stored in storage devices 106*a*-106*b* to obtain parity information; this parity bit sequence is stored in storage device 106*c*. For example, the leftmost parity bit in parity bit sequence 108*c* is generated by XORing the leftmost bit in data bit sequence 108*a* on storage device 106*a*, the leftmost bit in data bit sequence 108*b* on storage device 106*b*, and all other leftmost bits in corresponding data bit sequences on the other storage devices (i.e., storage devices 2 through (m−1)). Similarly, the data bits in the second-from-left position in data bit sequences 108*a*-108*b* are XORed to obtain the parity bit in the second-from-left position in parity bit sequence 108*c* and so on. In this particular example, if the number of data bits which have a value of 1 is odd, then the corresponding parity bit has a value of 1; if the number of data bits which have a value of 1 is even, then the parity bit has a value of 0.

In some embodiments, storage devices 106*a*-106*c* include solid state storage (also referred to as Flash chips). In some Flash embodiments, data bit sequences 108*a*-108*b* and parity bit sequence 108*c* are the size of a page and each has the same page number and block number (e.g., but on a different Flash chip). In some embodiments (e.g., either solid state or magnetic), the size of data bit sequences 108*a*-108*b* (and thus parity bit sequence 108*c*) is the same length as an error correction encoded codeword. In some embodiments, storage devices 106*a*-106*c* include magnetic storage (e.g., each storage device is a magnetic disk).

When some stored data is desired, read controller 102 in storage controller 100 accesses the appropriate storage device(s) and performs error correction decoding on the read data. In this example, storage devices 106a-106b (and, in some cases, storage device 106c) return stored bits to read controller 102 as soft information, as opposed to hard information. Whereas hard information only contains a decision or a value (e.g., a 0 versus a 1), soft information includes a certainty or likelihood in a particular decision or value. One example of soft information is a log-likelihood ratio (LLR). The sign of the LLR indicates the decision or value (e.g., a positive sign (+) corresponds to 0 and a negative sign (−) corresponds to 1) and the magnitude of the LLR indicates certainty in a particular decision or value (e.g., a larger magnitude indicates a greater certainty). If the read data is able to be properly error correction decoded (e.g., using the soft information), the decoded data is output.

If, however, the encoded data is unable to be properly error correction decoded, read controller 102 obtains the corresponding parity bit sequence on storage device 106c and the other data bit sequences associated with that parity bit sequence. As described above, data bit sequences and parity bit sequences are read back as soft information. In one example, if data bit sequence 108a is desired but is unable to be properly error correction decoded, parity bit sequence 108c is obtained, as well as the other data bit sequences which contributed to parity bit sequence 108c, such as data bit sequence 108b.

If all of the other data bit sequences are able to be successfully error correction decoded, then desired data bit sequence which was unable to be successfully decoded can be recovered. For example, if m=2 and data bit sequence 108a is desired (but was unable to be successfully error correction decoded) then data bit sequence 108a can be recovered from the relationship: parity bit sequence 108c=decoded, data bit sequence 108a XOR decoded, data bit sequence 108b.

In some cases, there is at least one other data bit sequence which is unable to be successfully decoded. For example, if m≥2 and data bit sequence 108a is the desired but uncorrectable data bit sequence, the above technique will not work if data bit sequence 108b is also unable to be successfully decoded. The following figure describes a process performed by read controller 102 in such situations. The technique described herein may be used in other applications and/or other systems than the exemplary applications and systems described herein.

Figure 2:
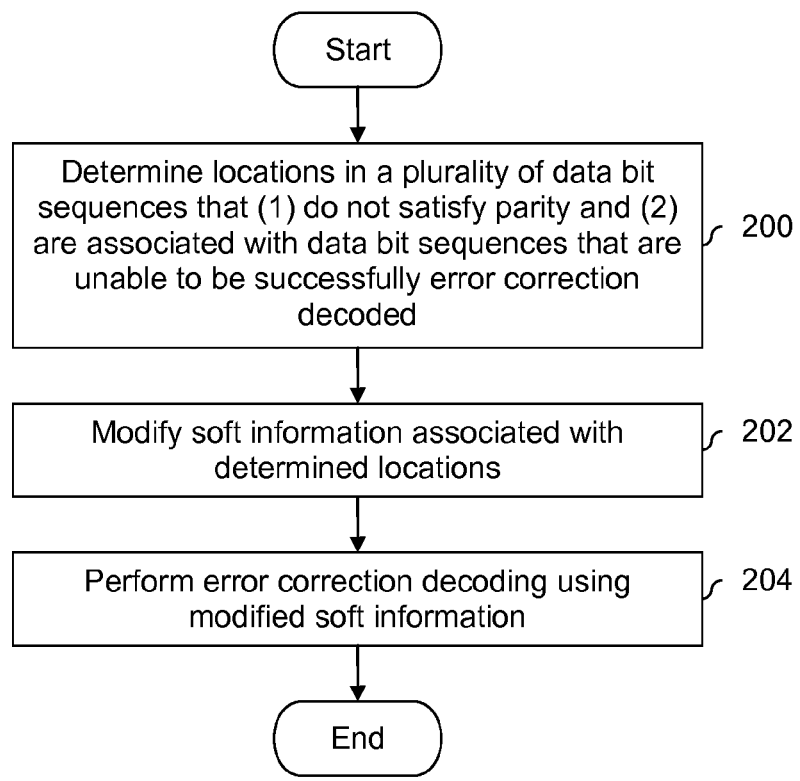

FIG. 2 is a flowchart illustrating an embodiment of a soft information modification technique. In the example shown, the process is performed when at least one other data bit sequence is unable to be properly decoded, in addition to a desired data bit sequence that is unable to be properly decoded. The example of FIG. 2 will be example using FIG. 3, which is a diagram showing an embodiment of a plurality of data bit sequences and a related parity bit sequence. In that example, bit sequences 300-303 are data bit sequences and bit sequence 304 is the corresponding parity bit sequence. In some embodiments, each of bit sequences 300-304 is stored on a different chip.

Figure 3:
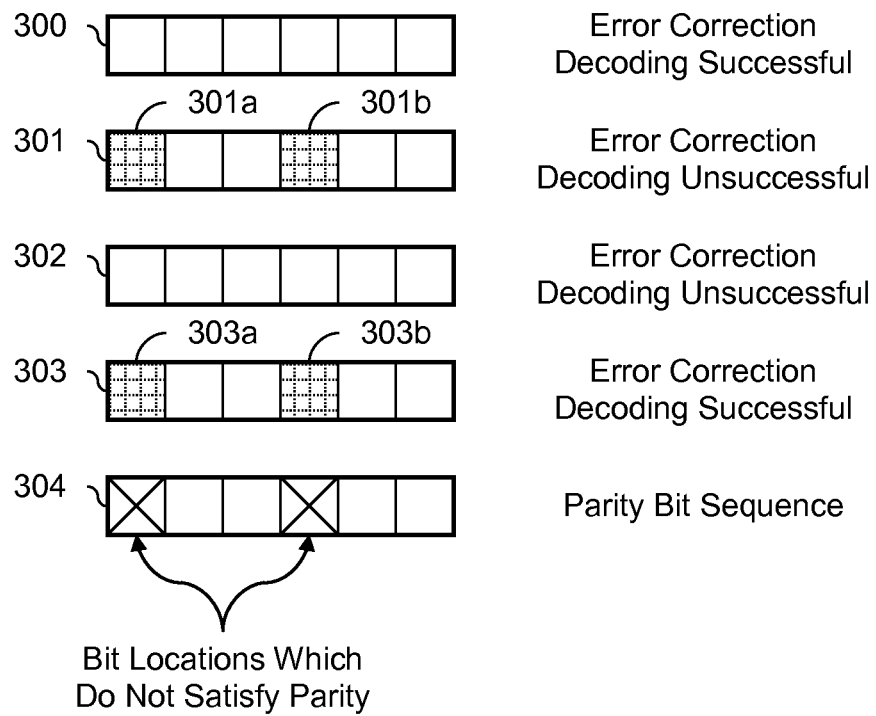

At 200, locations in a plurality of data bit sequences that (1) do not satisfy parity and (2) are associated with data bit sequences that are unable to be successfully error correction decoded are determined. In FIG. 3, for example, locations 301a-301b and 303a-303b (shown with a grid pattern) would be determined at step 200. Parity bit sequence 304 shows that the leftmost position and third-from-right position do not satisfy parity and as the descriptions next to data bit sequences 301 and 302 indicate, those data bit sequences are unable to be successfully error correction decoded. For example, a maximum number of decoding attempts may have been reached without successfully error correction decoding those sequences.

In various embodiments, step 200 is performed in a variety of ways. In one example, the second criteria (i.e., data bit sequences that are unable to be successfully error correction decoded) is first determined (e.g., in FIG. 3, narrowing the set of data bit sequences 300-303 to data bit sequences 301-302) and then further narrowing that set to locations within those bit sequences that do not satisfy parity (e.g., locations 301a-301b in data bit sequence 301 and locations 303a-303b in data bit sequence 303). Conversely, step 200 can be performed in the opposite sequence. In some embodiments, two sets which respectively satisfy the first criteria (i.e., not satisfying parity) and the second criteria (i.e., data bit sequences that are unable to be successfully error correction decoded) are determined separately and the two sets are cross referenced to determine which locations satisfy both criteria.

Returning to FIG. 2, soft information associated with the determined locations is modified at 202. For example, in FIG. 3, LLR values associated with locations 301a-301b and 303a-303b are modified. Any appropriate modification technique may be used at step 202; some examples are described in further detail below.

At 204, error correction decoding is performed using the modified soft information. For example, in FIG. 3, error correction decoding may be performed again for data bit sequences 301 and 303. In one example, for data bit sequence 301, modified LLR values are used for the leftmost and third-from-right position and unmodified LLR values are used for all other positions.

Figure 4:
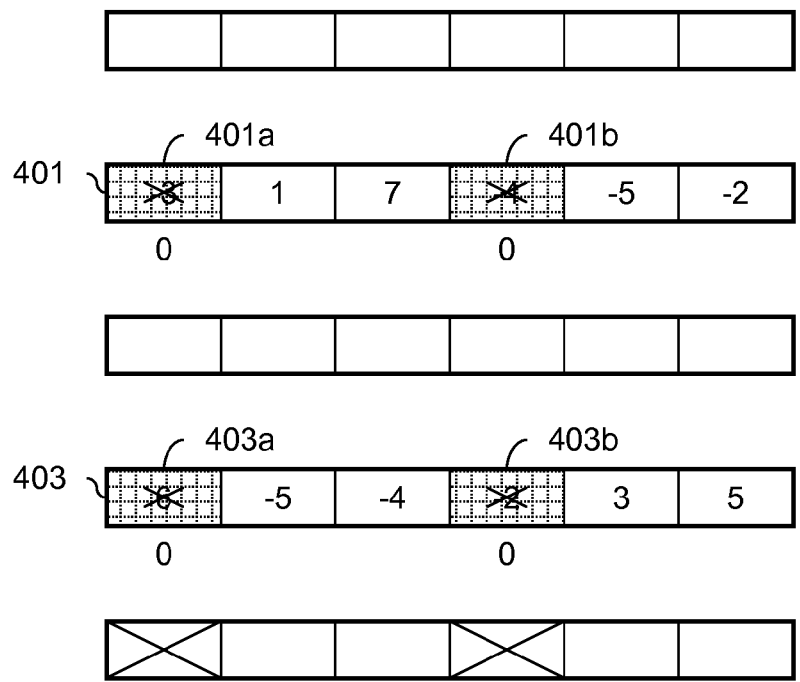

FIG. 4 is a diagram showing an embodiment in which soft information is replaced with an erasure. FIG. 4 shows a more detailed example of the data bit sequences and parity bit sequence shown in FIG. 3. In the example shown, the (uncorrectable) codeword associated with data bit sequence 401 has an LLR sequence of [−3 1 7 −4 −5 −2] and the (uncorrectable) codeword associated with data bit sequence 403 has an LLR sequence of [6 −5 −4 −2 3 5]. In this example, LLR values range from −7 to 7 where a positive sign corresponds to a 1 and a negative sign corresponds to a 0. A magnitude of 7 indicates the highest certainty in a decision and a 0 is referred to as an erasure. Although some figures show LLR embodiments, the techniques described herein are applicable to any type of soft information.

In this example, the LLRs at locations that do not satisfy parity and are associated with uncorrectable data bit sequences are replaced with an erasure (i.e., an LLR of 0). As such, the LLR values at locations 401a-401b and 403a-403b are replaced with an LLR of 0. Error correction decoding then repeated with the modified LLRs. For data bit sequence 401 this means uses an LLR sequence of [0 1 7 0 −5 −2] and using an LLR sequence of [0 −5 −4 0 3 5] for data bit sequence 403. Replacing LLR values with an erasure may be attractive because it is inexpensive and/or computationally easy.

Figure 5:
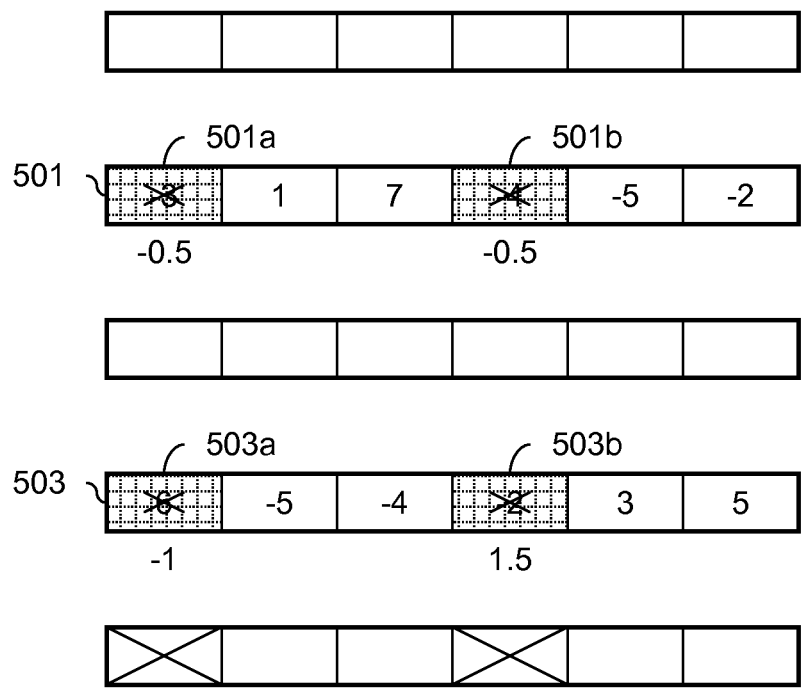

FIG. 5 is a diagram showing an embodiment in which soft information is modified using soft information from other bit locations within a codeword. In this example, the following equation is used to modifying soft information for a given bit location using soft information from other bit locations within that codeword:

$$LLR_{i,j} = \alpha \min_{\forall k \neq j}(mag(LLR_{i,k})) \cdot \prod_{\forall k \neq j} \text{sign}(LLR_{i,k})$$

where $\alpha$ is a scaling factor between 0 and 1 and the LLR at bit location i (e.g., leftmost as in 501a) in codeword j (e.g., data bit sequence 501) is being modified. In the example equation above, the sign is determined based on the decisions from other locations in the same codeword (i.e., $\Pi_{\forall k \neq j}$ sign $(LLR_{i,k})$) and the magnitude is determined based on the scaling factor (i.e., $\alpha$) and the certainties from other locations in the same codeword (i.e., $\min_{\forall k \neq j}(mag(LLR_{i,k}))$).

For $\alpha = 0.5$ and the LLR values at 501a-501b and 503a-503b, for example, this produces:

$LLR_{501a} = 0.5 \cdot \min(1,7,4,5,2) \cdot (1 \cdot 1 \cdot -1 \cdot -1 \cdot -1) = -0.5$ $LLR_{501b} = 0.5 \cdot \min(3,1,7,5,2) \cdot (-1 \cdot 1 \cdot 1 \cdot -1 \cdot -1) = -0.5$ $LLR_{503a} = 0.5 \cdot \min(5,4,2,3,5) \cdot (-1 \cdot -1 \cdot -1 \cdot 1 \cdot 1) = -1$ $LLR_{503b} = 0.5 \cdot \min(6,5,4,3,5) \cdot (1 \cdot -1 \cdot -1 \cdot 1 \cdot 1) = -1.5$ Error correction decoding would be repeated using an LLR sequence of [−0.5 1 7 −0.5 −5 −2] for data bit sequence 501 and an LLR sequence of [−1 −5 −4 1.5 3 5] for data bit sequence 503.

In some embodiments, in a first attempt, one of the techniques shown in FIGS. 4 and 5 is attempted first. If unsuccessful, the other technique is attempted. For example, in some embodiments, first the technique shown in FIG. 4 is attempted (e.g., because it requires no computation). If error correction decoding is unsuccessful with the modified soft information generated by way of FIG. 4, the technique shown in FIG. 5 may be used. In some embodiments the ordering is reversed.

Figure 6:
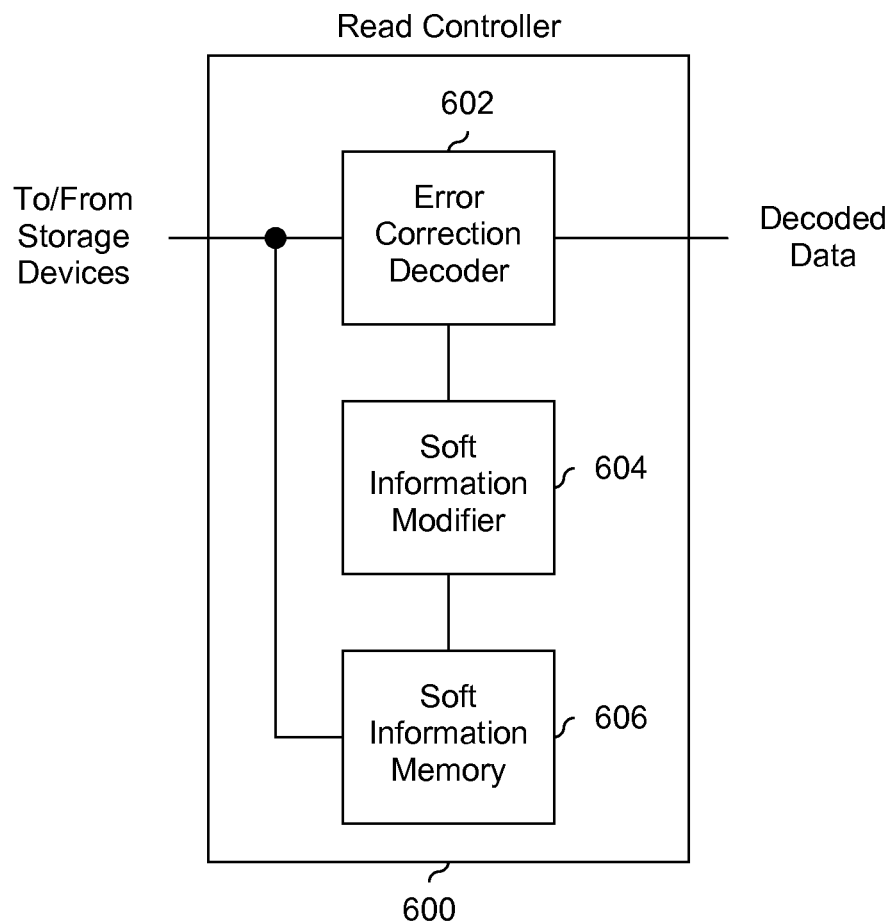

FIG. 6 is a diagram showing an embodiment of a read controller configured to perform soft information modification. In the example shown, soft information is input from one or more storage devices and is stored in soft information memory 606. If the soft information is able to be error correction decoded by error correction decoder 602, then the stored soft information in memory 606 is deleted. If, however, the stored soft information is to be modified (e.g., because there is at least one related codeword, in addition to a desired codeword, which cannot be properly error correction decoding), soft information modifier 604 accesses the stored information in memory 606 and passes soft information (some bit locations of which are modified and some of which are not) to error correction decoder 602. In some embodiments, soft information modifier 604 performs steps 200 and 202 in FIG. 2 and step 204 is performed by error correction decoder 602.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for modifying soft information, comprising:
    using a processor to determine one or more locations in a plurality of data bit sequences that (1) do not satisfy parity and (2) are associated with data bit sequences that are unable to be successfully error correction decoded;
    modifying soft information associated with the determined locations, including by replacing the soft information with an erasure; and
    performing error correction decoding using the modified soft information.

2. The method of claim 1, wherein the method is performed by a semiconductor device, including one or more of the following: an application-specific integrated circuit (ASIC) or a field-programmable gate array (FPGA).

3. The method of claim 1, wherein performing error correction decoding includes using one or more of the following: a low-density parity-check (LDPC) code, a Reed-Solomon (RS) code, a Hamming code, or a linear block code.

4. The method of claim 1, wherein the soft information includes a log-likelihood ratio (LLR).

5. A method for modifying soft information, comprising:
    using a processor to determine one or more locations in a plurality of data bit sequences that (1) do not satisfy parity and (2) are associated with data bit sequences that are unable to be successfully error correction decoded;
    modifying soft information associated with the determined locations, including by determining a sign based at least in part on signs associated with other locations in a same codeword as the soft information being modified; and
    performing error correction decoding using the modified soft information.

6. The method of claim 5, wherein the method is performed by a semiconductor device, including one or more of the following: an application-specific integrated circuit (ASIC) or a field-programmable gate array (FPGA).

7. The method of claim 5, wherein performing error correction decoding includes using one or more of the following: a low-density parity-check (LDPC) code, a Reed-Solomon (RS) code, a Hamming code, or a linear block code.

8. The method of claim 5, wherein the soft information includes a log-likelihood ratio (LLR).

9. A method for modifying soft information, comprising:
    using a processor to determine one or more locations in a plurality of data bit sequences that (1) do not satisfy parity and (2) are associated with data bit sequences that are unable to be successfully error correction decoded;
    modifying soft information associated with the determined locations, including by determining a magnitude based at least in part on magnitudes associated with other locations in a same codeword as the soft information being modified; and
    performing error correction decoding using the modified soft information.

10. The method of claim 9, wherein the method is performed by a semiconductor device, including one or more of the following: an application-specific integrated circuit (ASIC) or a field-programmable gate array (FPGA).

11. The method of claim 9, wherein performing error correction decoding includes using one or more of the following: a low-density parity-check (LDPC) code, a Reed-Solomon (RS) code, a Hamming code, or a linear block code.

12. The method of claim 9, wherein the soft information includes a log-likelihood ratio (LLR).

13. A system for modifying soft information, comprising:
    a soft information modifier configured to:
        determine one or more locations in a plurality of data bit sequences that (1) do not satisfy parity and (2) are associated with data bit sequences that are unable to be successfully error correction decoded; and
        modify soft information associated with the determined locations, including by replacing the soft information with an erasure; and
    an error correction decoder configured to perform error correction decoding using the modified soft information.

14. The system of claim 13, wherein the system includes a semiconductor device, including one or more of the following: an application-specific integrated circuit (ASIC) or a field-programmable gate array (FPGA).

15. The system of claim 13, wherein the error correction decoder is configured to perform error correction decoding using one or more of the following: a low-density parity-check (LDPC) code, a Reed-Solomon (RS) code, a Hamming code, or a linear block code.

16. The system of claim 13, wherein the soft information includes a log-likelihood ratio (LLR).

17. A system for modifying soft information, comprising:
a soft information modifier configured to:
determine one or more locations in a plurality of data bit sequences that (1) do not satisfy parity and (2) are associated with data bit sequences that are unable to be successfully error correction decoded; and
modify soft information associated with the determined locations, including by determining a sign based at least in part on signs associated with other locations in a same codeword as the soft information being modified; and
an error correction decoder configured to perform error correction decoding using the modified soft information.

18. The system of claim 17, wherein the system includes a semiconductor device, including one or more of the following: an application-specific integrated circuit (ASIC) or a field-programmable gate array (FPGA).

19. The system of claim 17, wherein the error correction decoder is configured to perform error correction decoding using one or more of the following: a low-density parity-check (LDPC) code, a Reed-Solomon (RS) code, a Hamming code, or a linear block code.

20. The system of claim 17, wherein the soft information includes a log-likelihood ratio (LLR).

21. A system for modifying soft information, comprising:
a soft information modifier configured to:
determine one or more locations in a plurality of data bit sequences that (1) do not satisfy parity and (2) are associated with data bit sequences that are unable to be successfully error correction decoded; and
modify soft information associated with the determined locations, including by determining a magnitude based at least in part on magnitudes associated with other locations in a same codeword as the soft information being modified; and
an error correction decoder configured to perform error correction decoding using the modified soft information.

22. The system of claim 21, wherein the system includes a semiconductor device, including one or more of the following: an application-specific integrated circuit (ASIC) or a field-programmable gate array (FPGA).

23. The system of claim 21, wherein the error correction decoder is configured to perform error correction decoding using one or more of the following: a low-density parity-check (LDPC) code, a Reed-Solomon (RS) code, a Hamming code, or a linear block code.

24. The system of claim 21, wherein the soft information includes a log-likelihood ratio (LLR).

25. A computer program product for modifying soft information, the computer program product being embodied in a non-transitory computer readable storage medium and comprising computer instructions for:
determining one or more locations in a plurality of data bit sequences that (1) do not satisfy parity and (2) are associated with data bit sequences that are unable to be successfully error correction decoded;
modifying soft information associated with the determined locations, including by replacing the soft information with an erasure; and
performing error correction decoding using the modified soft information.

26. The computer program product of claim 25, wherein the computer instructions for performing error correction decoding include computer instructions for using one or more of the following: a low-density parity-check (LDPC) code, a Reed-Solomon (RS) code, a Hamming code, or a linear block code.

27. The computer program product of claim 25, wherein the soft information includes a log-likelihood ratio (LLR).

28. A computer program product for modifying soft information, the computer program product being embodied in a non-transitory computer readable storage medium and comprising computer instructions for:
determining one or more locations in a plurality of data bit sequences that (1) do not satisfy parity and (2) are associated with data bit sequences that are unable to be successfully error correction decoded;
modifying soft information associated with the determined locations, including by determining a sign based at least in part on signs associated with other locations in a same codeword as the soft information being modified; and
performing error correction decoding using the modified soft information.

29. A computer program product for modifying soft information, the computer program product being embodied in a non-transitory computer readable storage medium and comprising computer instructions for:
determining one or more locations in a plurality of data bit sequences that (1) do not satisfy parity and (2) are associated with data bit sequences that are unable to be successfully error correction decoded;
modifying soft information associated with the determined locations, including by determining a magnitude based at least in part on magnitudes associated with other locations in a same codeword as the soft information being modified; and
performing error correction decoding using the modified soft information.

* * * * *